United States Patent
Manning et al.

(10) Patent No.: US 6,169,331 B1
(45) Date of Patent: Jan. 2, 2001

(54) APPARATUS FOR ELECTRICALLY COUPLING BOND PADS OF A MICROELECTRONIC DEVICE

(75) Inventors: Troy A. Manning; Michael B. Ball, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/143,526

(22) Filed: Aug. 28, 1998

(51) Int. Cl.$^7$ .................. H01L 23/495; H01L 23/48; H01L 29/06; H01L 29/44; H01L 29/50

(52) U.S. Cl. .................. 257/784; 257/786; 257/776; 257/780; 257/690; 257/693; 257/772; 257/779; 257/691; 257/666; 257/723

(58) Field of Search .................. 257/784, 786, 257/776, 666, 780, 723, 686, 685, 690–693, 772, 779

(56) References Cited

U.S. PATENT DOCUMENTS

| | | | |
|---|---|---|---|
| 4,080,485 | * 3/1978 | Bonkohara | 257/784 |
| 4,241,360 | * 12/1980 | Hambor et al. | 257/784 |
| 4,359,754 | * 11/1982 | Hayakawa et al. | 257/784 |
| 4,403,240 | * 9/1983 | Seki et al. | 257/503 |
| 4,750,666 | 6/1988 | Neugebauer et al. | 228/160 |
| 4,984,065 | * 1/1991 | Sako | 257/784 |
| 5,036,015 | 7/1991 | Sandhu et al. | 437/8 |
| 5,058,798 | 10/1991 | Yamazaki et al. | 228/110 |
| 5,081,520 | * 1/1992 | Yoshii et al. . | |
| 5,235,212 | 8/1993 | Shimizu et al. | 257/780 |
| 5,298,793 | * 3/1994 | Kotani et al. | 257/784 |
| 5,343,064 | 8/1994 | Spangler et al. | 257/350 |
| 5,355,004 | * 10/1994 | Saitoh | 257/211 |
| 5,359,227 | * 10/1994 | Liang et al. | 257/784 |
| 5,367,195 | * 11/1994 | DiGiacomo et al. | 257/767 |
| 5,371,654 | 12/1994 | Beaman et al. | 361/744 |
| 5,384,487 | * 1/1995 | Rostoker et al. | 257/786 |
| 5,492,863 | 2/1996 | Higgins, III | 437/183 |
| 5,539,251 | 7/1996 | Iverson et al. | 257/670 |
| 5,550,083 | 8/1996 | Koide et al. | 437/183 |
| 5,559,428 | 9/1996 | Li et al. | 324/71.5 |
| 5,587,607 | * 12/1996 | Yasuda et al. | 257/784 |
| 5,650,914 | * 7/1997 | DiStefano et al. | 361/704 |
| 5,677,574 | * 10/1997 | Hisaka | 257/776 |
| 5,681,647 | * 10/1997 | Caillat | 428/209 |
| 5,712,695 | * 1/1998 | Tanaka et al. | 349/79 |
| 5,723,906 | * 3/1998 | Rush | 257/784 |
| 5,804,876 | * 9/1998 | Lake et al. | 257/737 |
| 5,808,354 | * 9/1998 | Lee et al. | 257/784 |
| 5,817,030 | * 10/1998 | Tarjan et al. | 600/546 |
| 5,818,564 | * 10/1998 | Gray et al. | 349/161 |
| 5,821,624 | * 10/1998 | Pasch | 257/776 |
| 5,828,116 | * 10/1998 | Ao | 257/69 |
| 5,838,072 | * 11/1998 | Li et al. | 257/776 |
| 5,854,513 | * 12/1998 | Kim | 257/737 |
| 5,879,530 | * 3/1999 | Caillat | 205/122 |
| 5,909,055 | * 6/1999 | Yamashita et al. | 257/693 |
| 5,923,091 | * 7/1999 | Nagai | 257/786 |
| 6,008,533 | * 12/1999 | Bruce et al. | 257/691 |
| 6,008,542 | * 12/1999 | Takamori | 257/773 |
| 6,013,944 | * 1/2000 | Moriya et al. | 257/668 |
| 6,025,651 | * 2/2000 | Nam | 257/788 |
| 6,028,354 | * 2/2000 | Hoffman | 257/706 |

* cited by examiner

Primary Examiner—Alexander O. Williams
(74) Attorney, Agent, or Firm—Dorsey & Whitney LLP

(57) ABSTRACT

A method and apparatus for electrically coupling bond pads on the surface of a microelectronic device. The apparatus can include a microelectronic device having at least two bond pads with a conductive member extending between the bond pads, external to the device. In one embodiment, the conductive member can be connected directly to the bond pads and can extend between the bond pads at or above the surface of the microelectronic device. In another embodiment, the conductive member can be connected on top of another conductive member previously attached to one of the bond pads. The conductive members can be attached to each other or to the bond pads with either ball bonds or wedge bonds to provide electrical signals to selected bond pads of the microelectronic device.

79 Claims, 8 Drawing Sheets

APPARATUS FOR ELECTRICALLY COUPLING BOND PADS OF A MICROELECTRONIC DEVICE

TECHNICAL FIELD

The present invention relates to methods and apparatuses for electrically coupling bond pads of a microelectronic device.

BACKGROUND OF THE INVENTION

Computers and other electronic devices typically include a number of interconnected semiconductor devices. The semiconductor devices include a semiconductor chip or die containing internal circuitry. The dies are generally mounted in a package and connected to other semiconductor devices through external pins or contacts. However, the dies may also be connected directly to other circuitry, including another semiconductor die.

FIG. 1A is a side elevation view of a portion of a semiconductor die 20 having two bond pads 21 (shown as 21a and 21b) on a surface of the die. The bond pads 21 may be coupled to each other with circuitry 53 that is internal to the semiconductor die 20, as shown schematically in FIG. 1A. One bond pad 21a is electrically coupled with a wire 50 to a lead finger 43 of a conductive lead frame 40. In one conventional arrangement, one end of the wire 50 is bonded to the bond pad 21a with a "ball bond" 60 and the other end of the wire 50 is bonded to the lead finger 43 with a "wedge bond" 70. The semiconductor die 20 and the lead frame 40 may then be encapsulated in a plastic material (not shown) and ends 42 of adjacent lead fingers 43 (one of which is shown in FIG. 1A) may be bent downward to form connection pins. The pins may be inserted into corresponding sockets of another device (not shown) to couple the semiconductor die with the other device.

FIG. 1B is an enlarged side elevation view of a portion of the semiconductor die 20 shown in FIG. 1A, as the wire 50 is being attached to the bond pad 21a. The wire 50 can be attached with a wire bonding tool 30 (shown in FIG. 1B as a ball/wedge bonder 30a) by feeding the wire 50 downwardly through an aperture 31 of the ball/wedge bonder 30a and forming a wire ball 51 at the end of the wire 50. The ball/wedge bonder 30a then presses the wire ball 51 against the bond pad 21a while the remainder of the wire 50 extends approximately normal to the bond pad 21a. The bonder 30a then applies heat and/or pressure to the wire 50 at the wire ball 51 to bond the wire to the bond pad 21a, forming the ball bond 60 shown in FIG. 1A. For example, the bonder 30a can use a thermosonic or thermocompression process to apply both heat and pressure to the wire 50. The bonder 30a then moves along the wire 50 to the lead finger 43 and presses the wire 50 against the lead finger 43. The bonder again applies heat and/or pressure to the wire 50 to both bond the wire 50 to the lead frame 40 (forming the wedge bond 70 shown in FIG. 1A), and separate the bonded portion of the wire 50 from a remaining portion of the wire.

FIG. 2A is a side elevation view of the semiconductor die 20 having the wire 50 connected between the bond pad 21a and the lead finger 43 in accordance with another conventional arrangement in which a first wedge bond 70a is formed at the bond pad 21a and a second wedge bond 70b is formed at the lead finger 43. FIG. 2B is an enlarged side elevation view of a portion of the semiconductor die 20 shown in FIG. 2A as the wire 50 is being attached to the bond pad 21a.

Referring to FIG. 2B, the wire 50 can be attached to the bond pad 21a with a wedge/wedge bonder 30b by feeding the wire 50 through an aperture 31a of the wedge/wedge bonder 30b and pressing the wire 50 against the bond pad 21a. The wedge/wedge bonder 30b then applies heat and/or pressure to the wire 50 to bond the wire to the bond pad 21a, forming the first wedge bond 70a shown in FIG. 2A. The bonder 30b then moves along the wire 50 to the lead finger 43 and presses the wire against the lead finger 43. The bonder 30b again applies heat and/or pressure to the wire to bond the wire 50 to the lead finger 43, forming the second wedge bond 70b shown in FIG. 2A. In one conventional arrangement, the bonder 30b can apply sufficient heat and/or pressure to both bond the wire 50 to the lead frame 40 and separate the bonded wire from the remaining supply of wire. In another conventional arrangement, the bonded wire can be separated from the remaining wire by clipping the wire next to the second wedge bond 70b.

As discussed above, two or more bond pads 21 may be connected within the die 20 by internal circuitry 53. The internal circuitry 53 may include very small conductive lines. One drawback with this arrangement is that the conductive lines may have a high resistance, increasing the current necessary to transmit signals between the bond pads, and increasing the heat generated by each semiconductor die. In addition, internal circuitry 53 is inaccessible once the die has been manufactured. Accordingly, another drawback with conventional arrangements is that they may lack the flexibility for interconnecting bond pads that are not connected by the internal circuitry at the time of manufacture.

Yet a further drawback with the conventional methods and devices discussed above is that it may be difficult to route wires between the lead frame 40 and bond pads that are not proximate to the lead frame 40. For example, if one or more of the wires 50 is particularly long, so as to reach a particular bond pad, the wire may be more likely to break or contact other adjacent wires, creating a short circuit that can affect the operation of the semiconductor device.

SUMMARY OF THE INVENTION

The present invention is directed toward methods and apparatuses for electrically coupling bond pads of a microelectronic device. In one aspect of the invention, the apparatus can include first and second spaced apart bond pads on a surface of a microelectronic device. The microelectronic device can further include a conductive member connected to and extending between the first and second bond pads. The conductive member can be positioned on or above the surface of the microelectronic device. In one aspect of the invention, the conductive member can include a wire, and, in another aspect of the invention, the conductive member can include a flowable conductive material, such as a conductive epoxy. In still another aspect of the invention, the microelectronic device can include an insulating material between the conductive member and the surface of the microelectronic device.

In yet another aspect of the invention, the apparatus can include a microelectronic device having at least one bond pad for receiving wire connections. The microelectronic device can further include two wires connected to the same bond pad, for example, a first wire connected at one end to the bond pad with a first bond and a second wire connected at one end to the first bond with a second bond. Either or both of the first and second bonds can be a wedge bond or a ball bond, and the opposite ends of the first and second wires can be connected to other bond pads of the microelectronic device, or to external structures.

DETAILED DESCRIPTION OF THE INVENTION

The present invention is directed toward methods and apparatuses for conductively linking bond pads of microelectronic devices. The apparatus can include a microelectronic device having wires bonded between bond pads of a single device or between the bond pads of two devices. The wires can be bonded to the bond pads using various combinations of ball bonds, wedge bonds and other types of bonds. Many specific details of certain embodiments of the invention are set forth in the following description and in FIGS. 3A–8 to provide a further understanding of such embodiments. One skilled in the art, however, will understand that the present invention may have additional embodiments and that they may be practiced without several of the details described in the following description.

Figure 1A:
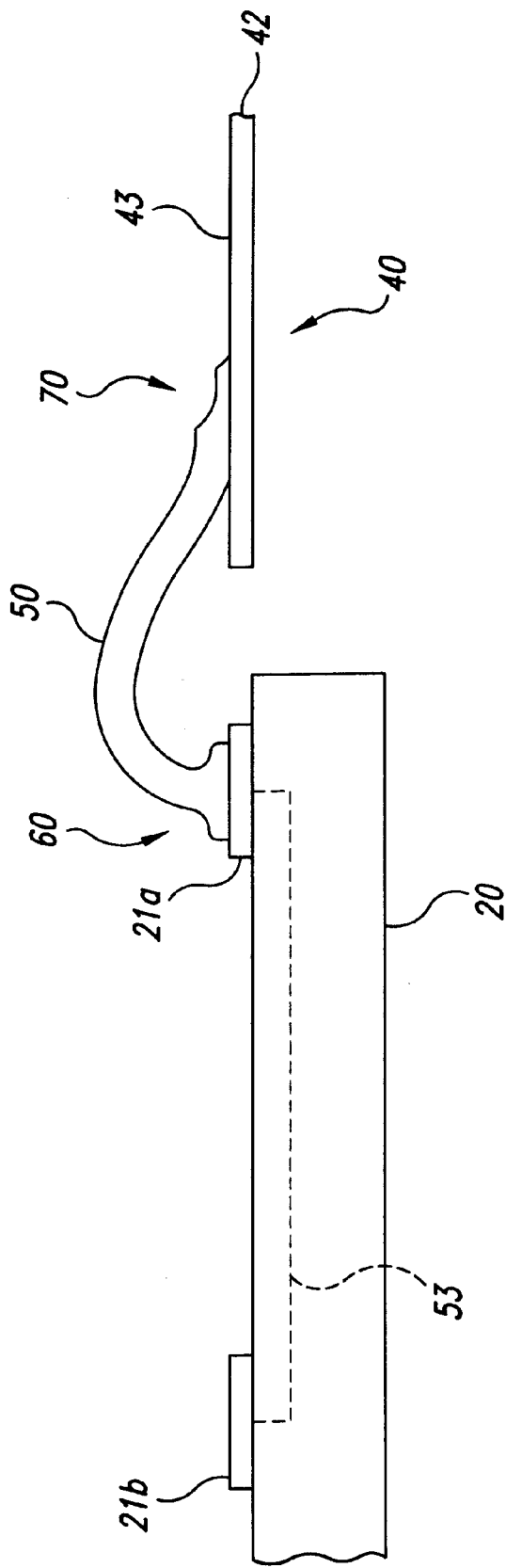
FIG. 1A is a side elevation view of a portion of a semiconductor die and lead frame in accordance with the prior art.
Figure 1B:
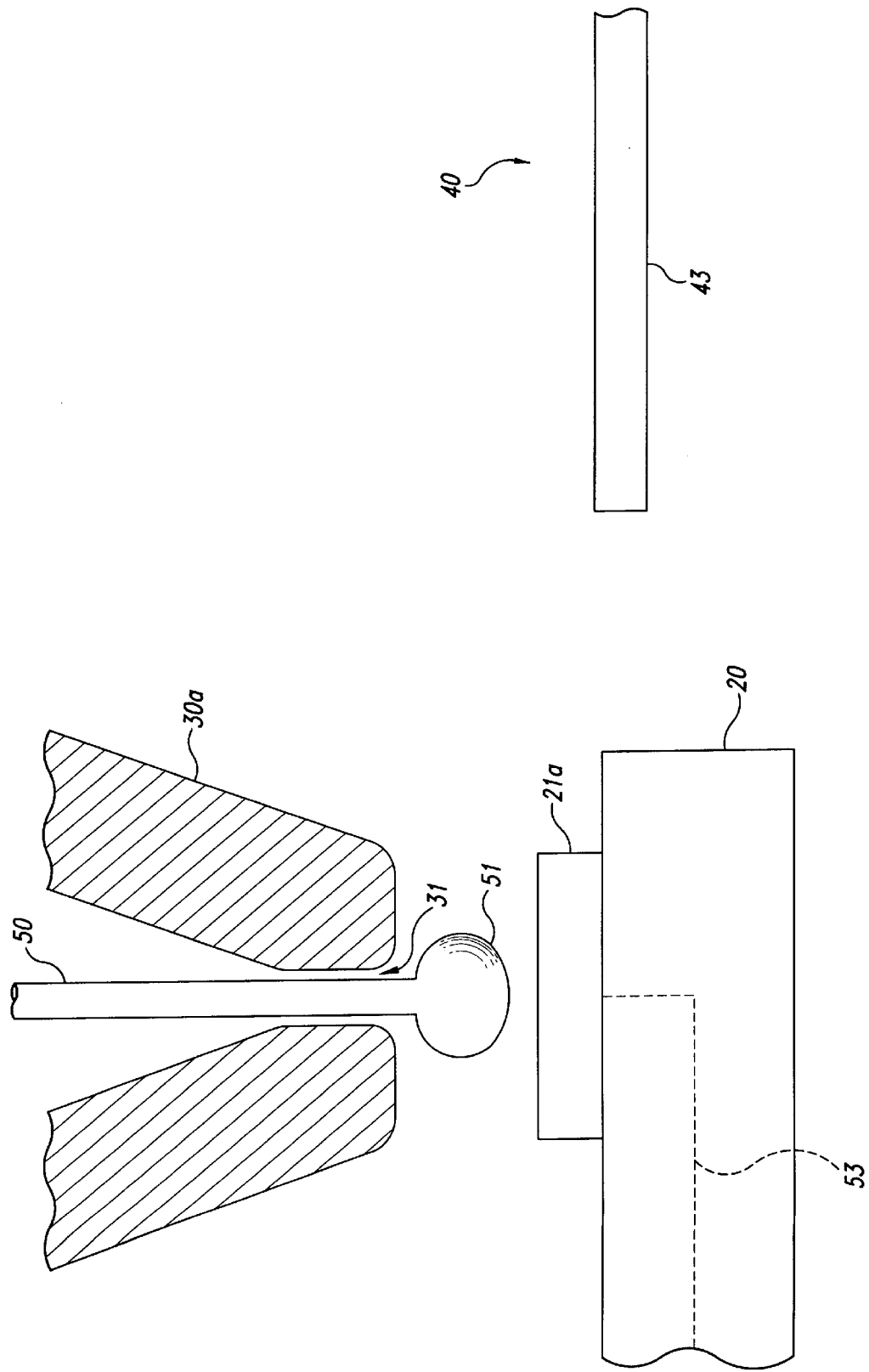
FIG. 1B is an enlarged partial cross-sectional side elevation view of a portion of the semiconductor die and the lead frame shown in FIG. 1A adjacent a wire bonding tool in accordance with the prior art.
Figure 2A:
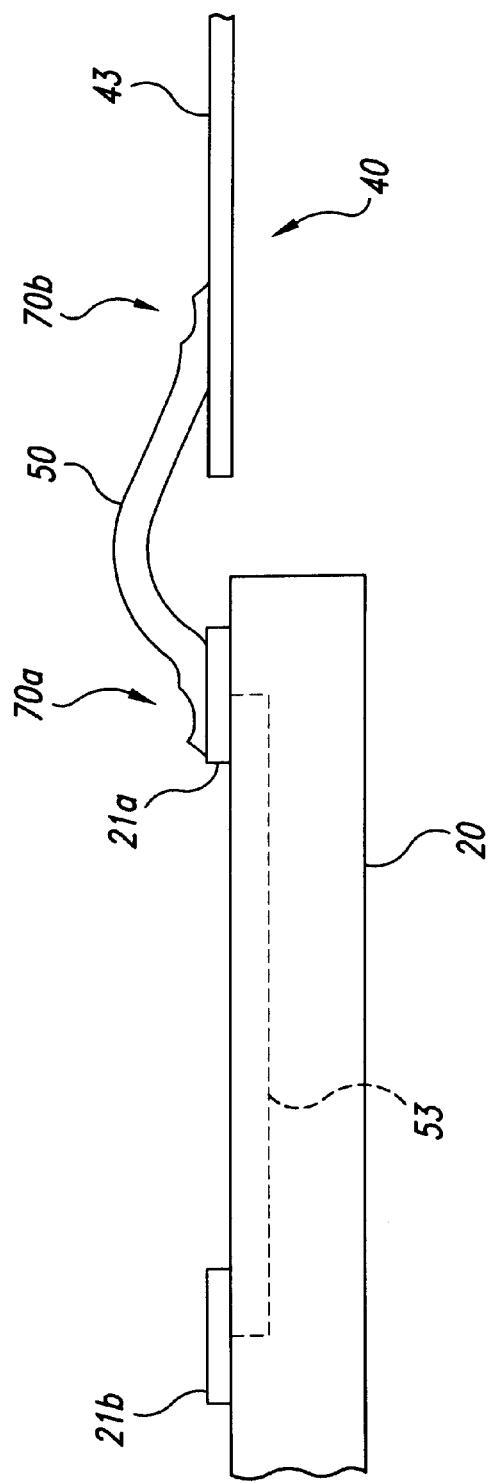
FIG. 2A is a side elevation view of a semiconductor die and lead frame in accordance with another embodiment of the prior art.
Figure 2B:
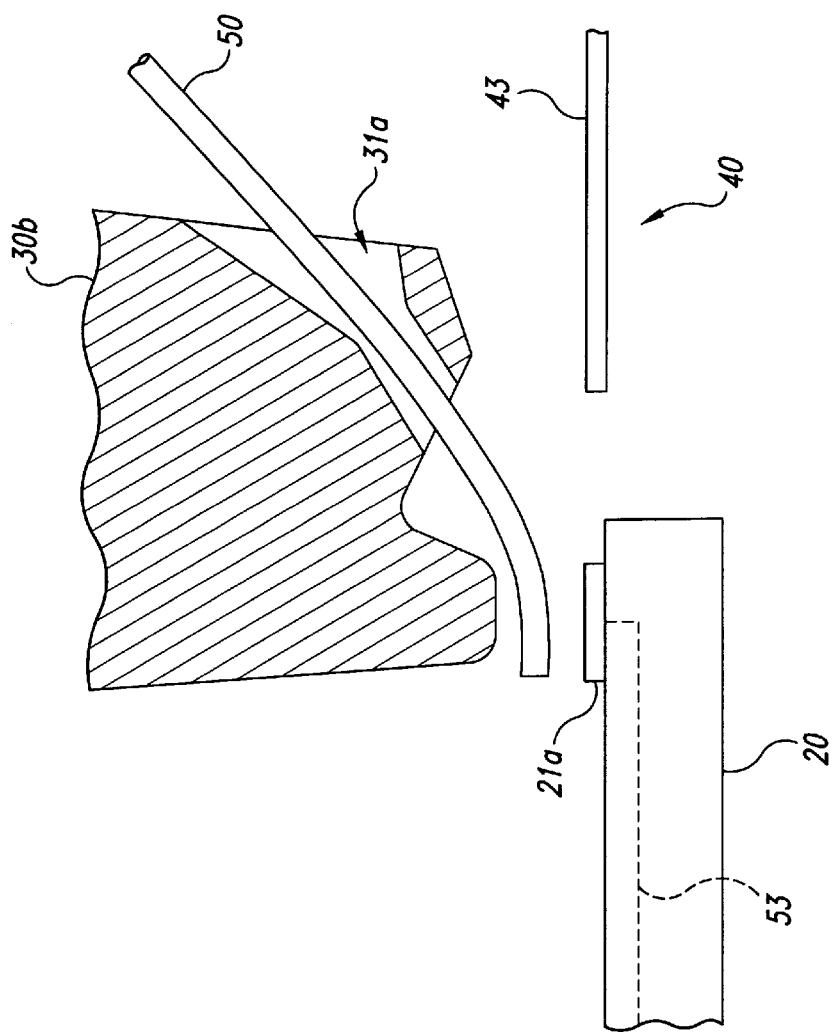
FIG. 2B is an enlarged partial cross-sectional side elevation view of a portion of the semiconductor die and the lead frame shown in FIG. 2A adjacent a wire bonding tool in accordance with another embodiment of the prior art.
Figure 3A:
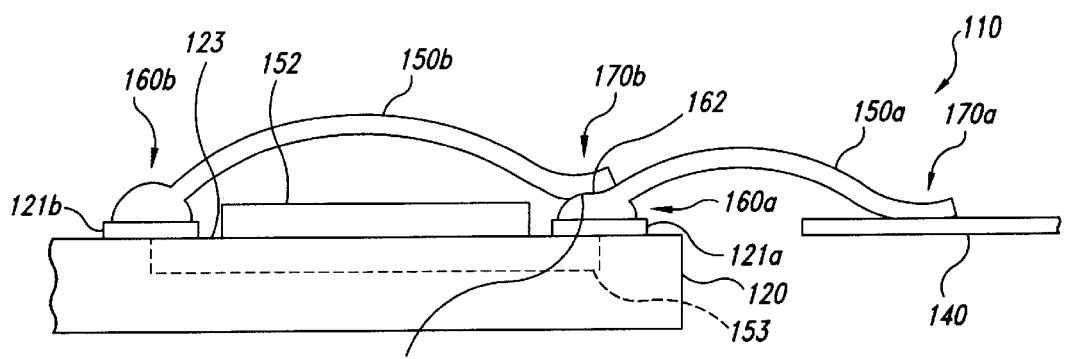
FIG. 3A is a side elevation view of a portion of a microelectronic device assembly having a bond pad with a ball bond and a wedge bond on top of the ball bond in accordance with an embodiment of the invention.

FIG. 3A is a side elevation view of a portion of a microelectronic device assembly 110 in accordance with an embodiment of the invention. The assembly 110 can include a microelectronic device 120 having bond pads 121 (shown as a first bond pad 121a and a second bond pad 121b) on an upper surface 123 of the microelectronic device 120. The bond pads 121 can be connected to each other or to external structures with conductive members 150 (shown as a first conductive member 150a and a second conductive member 150b) that are positioned external to the upper surface 123 of the microelectronic device 120. In one embodiment, the conductive members 150 can include wires made from aluminum, gold or other conductive materials, and in other embodiments, the conductive members 150 can include other structures and materials.

In one embodiment, the first conductive member 150a can be connected between the first bond pad 121a and an adjacent conductive structure, such as a lead frame 140. In one aspect of this embodiment, the first conductive member 150a can be connected to the first bond pad 121a with a ball bond 160a and can be connected to the lead frame 140 with a wedge bond 170a. The ball bond 160a can be made by forming an enlarged region at one end of the first conductive member 150a and then engaging the enlarged region with the bond pad 160a and applying heat and/or pressure to the first conductive member 150a and/or the bond pad 121a. The wedge bond 170a can be formed by engaging a side surface near the other end of the first conductive member 150a with the lead frame 140 and applying heat and/or pressure to the first conductive member 150a and/or the lead frame 140. Suitable devices for forming both the ball bond 160a and the wedge bond 170a are available from Small Precision Tools of Petaluma, Calif.

The bond pads 121a and 121b can be connected to each other with the second conductive member 150b. Accordingly, the second conductive member 150b can include a second ball bond 160b at the second bond pad 121b and a second wedge bond 170b at the first bond pad 121a. In one embodiment, a lower surface 171 of the second wedge bond 170b can be adjacent an upper surface 162 of the first ball bond 160a. In another embodiment, the second wedge bond 170b can be adjacent the first ball bond 160a in a side-by-side arrangement, for example, where the first bond pad 121a is large enough to permit such an arrangement.

An advantage of the assembly 110 shown in FIG. 3A is that the second conductive member 150b can provide a conductive link between the bond pads 121a and 121b without changing the internal circuitry of the microelectronic device 120. This can be advantageous where no internal connections couple the bond pads 121a and 121b at the time the microelectronic device 120 is manufactured, and where the conductive link provided by the second conductive member 150b can be used to modify or repair the microelectronic device 120 after it has been manufactured. Alternatively, where a conductive path does exist between the two bond pads 121a and 121b (for example, a metal layer or other internal circuitry 153 shown schematically in FIG. 3A), the second conductive member 150b can supplement the internal circuitry 153. In one embodiment, the second conductive member 150b can be relatively large when compared to the internal circuitry 153 and can accordingly reduce electrical resistance between the two bond pads 121a and 121b, increasing current flow and signal speed between the bond pads and decreasing the amount of heat generated by the microelectronic device 120.

Another advantage is that in one embodiment, at least some of the internal connections of the microelectronic device 120 can be eliminated and replaced with the external second conductive member 150b. This arrangement can make volume available within the microelectronic device 120 for other circuit elements, potentially increasing the capability of the microelectronic device 120.

Still another advantage is that a variety of microelectronic devices 120 can be made compatible with a single lead frame configuration, or conversely, a variety of lead frames 140 can be made compatible with a single microelectronic device configuration. For example, where the portion of the lead frame 140 shown in FIG. 3A is configured to be proximate to the first bond pad 121a, and a later version of the microelectronic device 120 requires that the signal produced at that portion of the lead frame 140 be transmitted to the second bond pad 121b, the second conductive member 150b can be used to route the signal to the second bond pad 121b.

Yet another advantage is that the second conductive member 150b can be selectively sized to affect the capacitance of circuits that include the first and second bond pads 121a and 121b. For example, the distance between the second conductive member 150b and the microelectronic device 120 can be varied and/or a dielectric material 152 can be positioned between the second conductive member 150b and the microelectronic device 120 to adjust the capacitance of selected circuits in the microelectronic device 120.

Figure 3B:
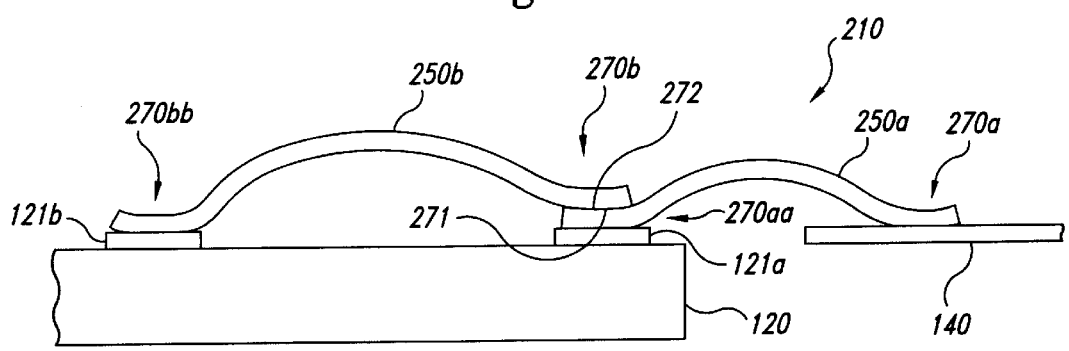
FIG. 3B is a side elevation view of a portion of a microelectronic device assembly having a bond pad with two wedge bonds attached to the bond pad in accordance with another embodiment of the invention.

FIG. 3B is a side elevation view of a portion of a microelectronic device assembly 210 having two wedge bonds 270aa and 270b attached to the first bond pad 121a in accordance with another embodiment of the invention. As shown in FIG. 3B, one end of a first conductive member 250a can be attached to the first bond pad 121a with the first wedge bond 270aa, and the other end of the first conductive member 250a can be attached to the lead frame 140 with a second wedge bond 270a. A second conductive member 250b can be connected between the first bond pad 121a and the second bond pad 121b with a third wedge bond 270b and a fourth wedge bond 270bb. In one embodiment, a lower surface 271 of the third wedge bond 270b engages an upper surface 272 of the first wedge bond 270aa. In another embodiment, the first wedge bond 270aa can be placed on top of the third wedge bond 270b, or the wedge bonds 270aa and 270b can be placed side by side, as discussed above with reference to FIG. 3A.

An advantage of the arrangement shown in FIG. 3B is that it may be easier to form wedge bonds than it is to form ball bonds because the wedge bonds do not require forming an enlarged portion at the end of the wire. Conversely, an advantage of the arrangement shown in FIG. 3A is that once the ball bond is formed at one end of the conductive member 150, the other end of the conductive member can be positioned in any direction relative to the ball bond, whereas in the arrangement shown in FIG. 3B, the tool that forms wedge bonds at both ends of the conductive members 250 can generally move in only one direction.

Furthermore, the ball bonds may be less likely than the wedge bonds to damage the structure to which they are attached. Accordingly, it may be advantageous to apply a ball bond to the relatively small bond pads 121 of the microelectronic device 120, and apply wedge bonds to the larger and more robust lead frames 140 (as shown in FIG. 3A). However, this difference between the arrangements shown in FIG. 3A and FIG. 3B may be less important where the tool forming the wedge bond clips the conductive member adjacent the wedge bond rather than deforming the conductive member to separate it from the wedge bond. In either case, the bond that is formed first on the bond pad 121, whether it is a wedge bond or a ball bond, can provide a support structure that protects the bond pad 121 from damage which might otherwise be incurred by the bonding tool.

Figure 3C:
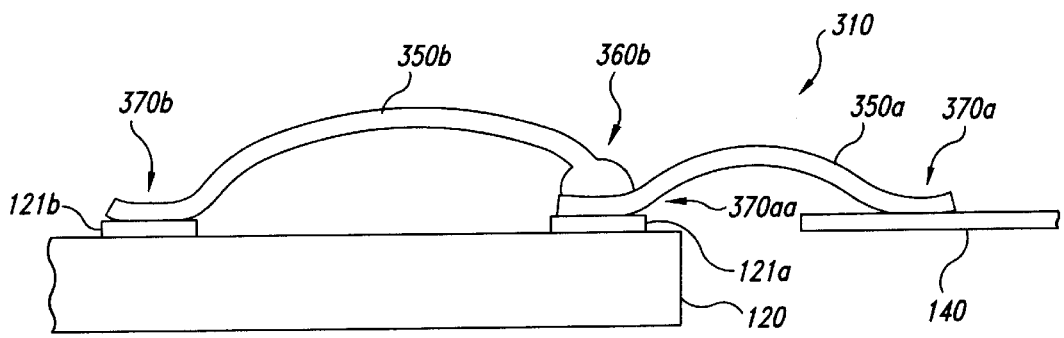
FIG. 3C is a side elevation view of a portion of a microelectronic device assembly having a bond pad with a wedge bond and a ball bond on top of the wedge bond in accordance with still another embodiment of the invention.

In other embodiments, other combinations of ball bonds and wedge bonds may be used to connect a bond pad 121 on one portion of a microelectronic device 120 with a bond pad 121 on another portion of the microelectronic device 120. For example, FIG. 3C is a side elevation view of a portion of a microelectronic device assembly 310 with a first conductive member 350a coupled to the lead frame 140 with a first wedge bond 370a and coupled to the first bond pad 121a with a second wedge bond 370aa. A second conductive member 350b can be coupled to the first bond pad 121a with a ball bond 360b on top of the second wedge bond 370aa, and can be coupled to the second bond pad 121b with a third wedge bond 370b.

Figure 3D:
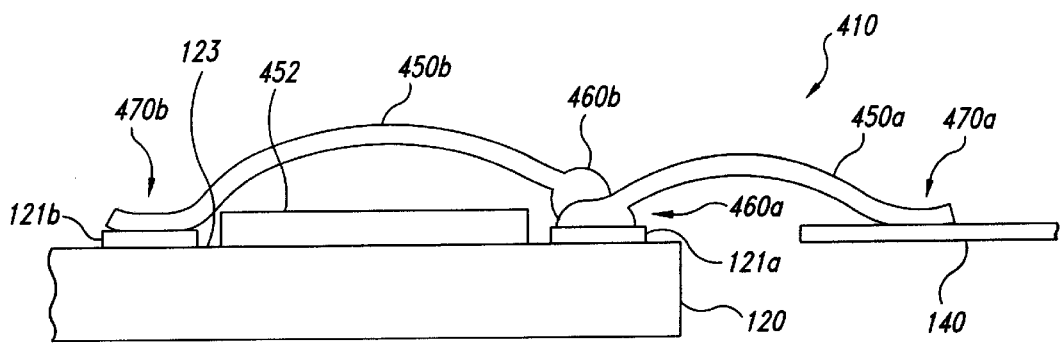
FIG. 3D is a side elevation view of a portion of a microelectronic device assembly having a bond pad with two ball bonds attached to the bond pad in accordance with yet another embodiment of the invention.

FIG. 3D is a side elevation view of a portion of yet another microelectronic device assembly 410 having a first conductive member 450a connected at one end to the first bond pad 121a with a first ball bond 460a and connected at the opposite end to the lead frame 140 with a first wedge bond 470a. A second conductive member 450b can be coupled to the first bond pad 121a with a second ball bond 460b that is positioned on top of the first ball bond 460a. The second conductive member 450b can then be connected to the second bond pad 121b with a second wedge bond 470b.

As shown in FIG. 3D, the assembly 410 can also include an insulator 452 positioned between the second conductive member 450b and the upper surface 123 of the microelectronic device 120. In one embodiment, the insulator 452 can include a polyimide and in other embodiments the insulator 452 can include other non-conductive materials. The insulator 452 can reduce the likelihood of contact between the second conductive member 450b and conductive structures (not shown) on the upper surface 123 of the microelectronic device 120.

Figure 3E:
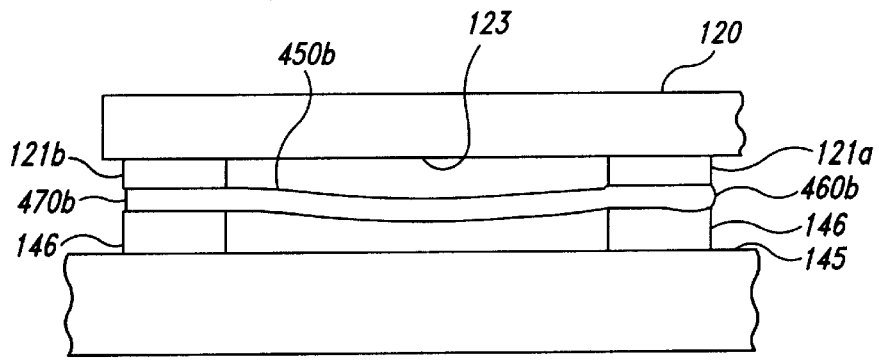
FIG. 3E is a side elevation view of a microelectronic device assembly in accordance with another embodiment of the invention.

In still a further embodiment shown in FIG. 3E, one or both of the bond pads 121 can be coupled directly to an external device without the first conductive member 450a. For example, in a "flip chip" embodiment, the microelectronic device 120 can be inverted and placed face down on a substrate 145 such that the upper surface 123 of the microelectronic device 120 faces the substrate 145 with the second ball bond 460b and the second wedge bond 470b connected directly to contacts 146 on the substrate 145. In other embodiments, this type of arrangement can include any of the bonding configurations shown in FIGS. 3A–3C.

Figure 4:
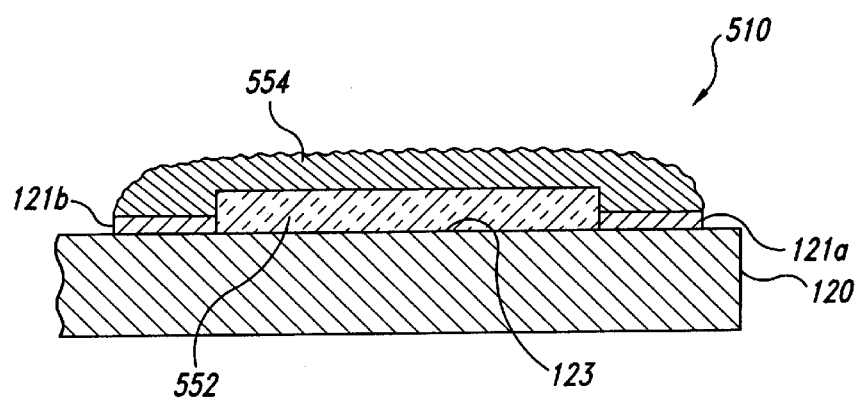
FIG. 4 is a cross-sectional side elevation view of a portion of a microelectronic device assembly having two bond pads connected to each other with a flowable conductive material in accordance with still another embodiment of the invention.

FIG. 4 is a cross-sectional side elevation view of a portion of a microelectronic device assembly 510 having two bond pads 121a and 121b directly connected with a flowable conductive material 554 in accordance with still another embodiment of the invention. In one embodiment, the conductive material 554 can include an epoxy having a suspension of conductive particles, such as silver, that create a conductive path between the bond pads 121. The epoxy can be applied in a liquid or paste form that then hardens to form a permanent connection between the bond pads. In other embodiments, other materials can be used to connect the bond pads 121, so long as they provide a conductive path between the bond pads.

The microelectronic device assembly 510 shown in FIG. 4 can also include an insulator 552 between the conductive material 554 and the upper surface 123 of the microelectronic device 120. As discussed above with reference to FIG.

3D, the insulator 552 can prevent electrical contact between the conductive material 554 and structures on the upper surface 123 of the microelectronic device 120.

An advantage of the assembly 510 shown in FIG. 4 is that it may be easier to apply the flowable conductive material 554 to the microelectronic device 120 than it is to attach the conductive members shown in FIGS. 3A–3D. For example, an applicator used to dispense the conductive material 554 can travel in any direction once initial contact has been made with one of the bond pads 121. Furthermore, the conductive material 554 may not require heat or pressure to form a bond with the bonds pads 121, reducing the likelihood of damaging either the bond pads 121 or the microelectronic device 120 in the region of the bond pads. Conversely, an advantage of the conductive members shown in FIGS. 3A–3D is that they may be more conductive than the conductive material 554, thereby providing faster signal speeds and less heat than the conductive material 554.

Figure 5:
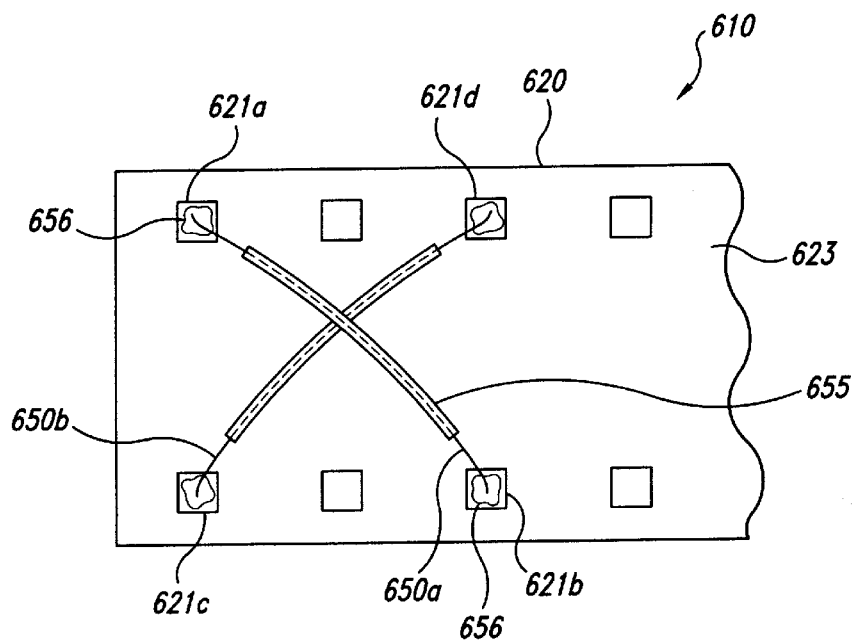
FIG. 5 is a top plan view of a portion of a microelectronic device assembly having two crossing conductive members extending between bond pads of the assembly.

FIG. 5 is a top plan view of a portion of a microelectronic device assembly 610 having a microelectronic device 620 with two crossing conductive members 650 (shown as a first conductive member 650a and a second conductive member 650b) connected between four bond pads 621 (shown as 621a–621d) of the microelectronic device 620. In one embodiment, the first conductive member 650a can be coupled between first and second bond pads 621a and 621b, and the second conductive member 650b can be coupled between third and fourth bond pads 621c and 621d such that two conductive members 650 cross over each other. In one aspect of this embodiment, one or both of the conductive members 650 can include an insulating layer 655 to prevent inadvertent electrical contact between the conductive members 650. Alternatively, insulators such as those shown in FIGS. 3D and 4 can be positioned between the first and second conductive members 650a and 650b, and/or between the conductive members and an upper surface 623 of the microelectronic device 620.

In one embodiment, wire bumps 656 can be disposed on the bond pads 621 beneath the conductive members 650 to reduce the likelihood of damaging the bond pads 621 when the conductive members 650 are coupled to the bond pads 621. Details of the wire bumps 656 and the application of the wire bumps to the bond pads 620 are disclosed in copending U.S. patent application Ser. No. 08/840,604, incorporated herein in its entirety by reference. Alternatively, where the bond pads 621 are connected to external devices, such as a lead frame, the conductive members 650 can be coupled to the bond pads 621 by attaching the conductive members on top of the bonds of other conductive members, in a manner generally similar to that shown in FIGS. 3A–3D. In still another embodiment, the conductive members 650 can be bonded directly to the corresponding bond pads 121 without any intermediate structures.

Figure 6:
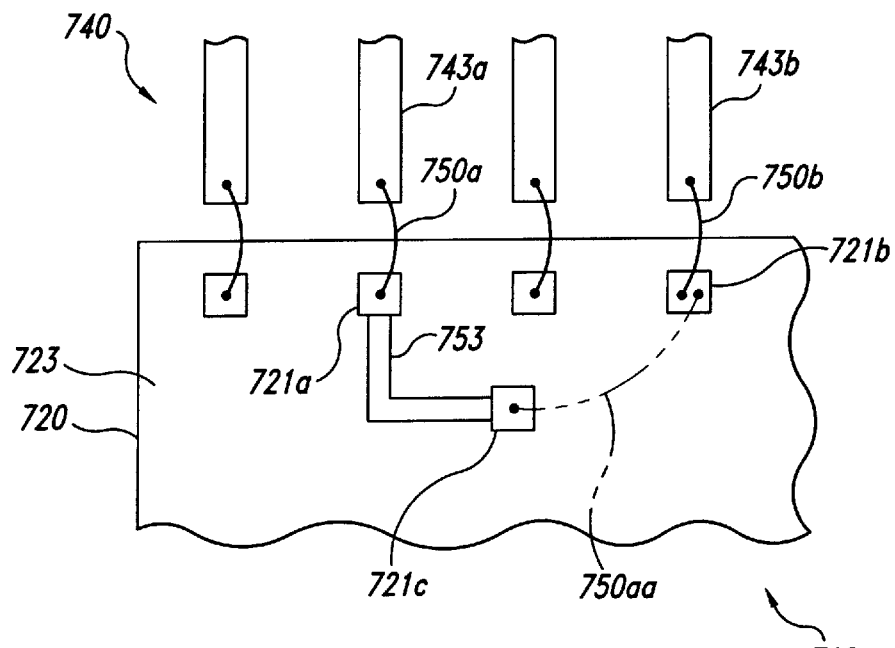
FIG. 6 is a top plan view of a microelectronic device assembly having conductive members extending between bond pads of the microelectronic device assembly in accordance with still another embodiment of the invention.

FIG. 6 is a top plan view of a microelectronic device assembly 710 that includes a microelectronic substrate 720 having bond pads 721 (shown as a first bond pad 721a and a second bond pad 721b). The assembly 710 further includes a lead frame 740 having lead fingers 743 (shown as a first lead finger 743a and a second lead finger 743b) positioned adjacent the microelectronic device 720. Each lead finger 743 may be coupled with a conductive member to a corresponding bond pad 721. For example, the first lead finger 743a can be coupled to the first bond pad 721a with a first conductive member 750a, and the second lead finger 743b can be coupled to the second bond pad 721b with a second conductive member 750b.

Alternatively, the second bond pad 721b can be coupled to the first lead finger 743a via a third conductive member 750aa, shown in dashed lines in FIG. 6. For example, the first lead finger 743a can be connected to the first bond pad 721a, as discussed above, and the first bond pad 721a can be connected to an auxiliary bond pad 721c with a conductive element 753, such as a flat metal layer 753. The conductive element 753 can be positioned either above, on, or below an upper surface 723 of the microelectronic device 720, and the auxiliary bond pad 721c can be connected to one end of the third conductive member 750aa. Accordingly, the conductive element 753, the auxiliary bond pad 721c, and the third conductive member 750aa can provide a connection between the second bond pad 721b and the first lead finger 743a.

An advantage of the assembly 710 shown in FIG. 6 is that the auxiliary bond pad 721c allows the second bond pad 721b to be coupled to the first lead finger 743a without routing the third conductive member 750aa over other lead fingers or over other bond pads. Accordingly, the assembly 710 can reduce the likelihood that the third conductive member 750aa will contact or otherwise interfere with other bond pads or lead fingers of the assembly 710.

Another advantage of the assembly 710 shown in FIG. 6 is that the auxiliary bond pad 721c can be positioned on the microelectronic device 720 such that the length of the third conductive member 750aa is less than it would be if it were to extend all the way to the first lead finger 743a. Accordingly, the third conductive member 750aa may be less likely to make electrical contact with other structures of the microelectronic device 720, and may be less likely to become entangled or otherwise engaged with such structures, which might damage the third conductive member 750aa. Furthermore, by placing the auxiliary bond pad 721c near the second bond pad 721b, the third conductive member 750aa may be more nearly "vertical"(as seen FIG. 6) near the second bond pad 721b, which may reduce stresses at the bond between the third conductive member 750aa and the second bond pad 721b.

Figure 7:
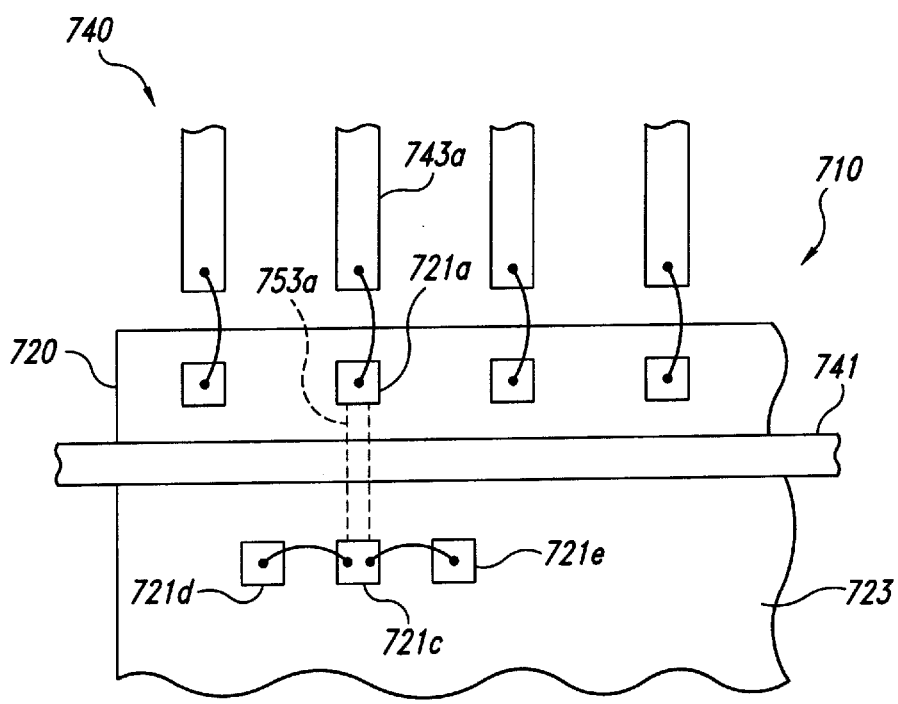
FIG. 7 is a top plan view of a microelectronic device assembly having a conductive member extending beneath a support portion of a lead frame in accordance with another embodiment of the invention.

FIG. 7 is a top plan view of another embodiment of the assembly 710 in which the lead frame 740 includes a bar or a bus 741 that extends over the upper surface 723 of the microelectronic device 720. Accordingly, the microelectronic device 720 can include a metal layer 753a that extends between the first bond pad 721a and the auxiliary bond pad 721c beneath the upper surface 723 of the microelectronic device 720 so as not to contact the bus 741. For example, in one embodiment, the metal layer 753a can be disposed beneath the upper surface 723 of the microelectronic device 720 during fabrication of the microelectronic device.

The microelectronic device 720 can further include third and fourth bond pads 721d and 721e that can be selectively coupled to the auxiliary bond pad 721c using any of the techniques described above with reference to FIGS. 3A–5. For example, in one embodiment, the third bond pad 721d can be connected to the auxiliary bond pad 721c to produce a desired operating characteristic, such as an operating voltage, in the microelectronic device 720. Alternatively, the fourth bond pad 721e can be connected to the auxiliary bond pad 721c to produce a different operating characteristic in the microelectronic device 720. In still another arrangement, both the third and fourth bond pads 721d and 721e can be connected simultaneously to the auxiliary bond pad 721c. Accordingly, an advantage of the assembly 710 shown in FIG. 7 is that the combination of the metal layer 753a and the auxiliary bond pad 721c can be used to route signals from the first lead finger 743a to one or more bond pads that are not adjacent the lead finger 743a. In alternate embodiments, the metal layer 753a can be replaced with insulated conductive members, such as those shown in FIG. 5, or other structures that similarly extend between the first bond pad 721*a* and the auxiliary bond pad 721*c* without making electrical contact with the bar 741.

Figure 8:
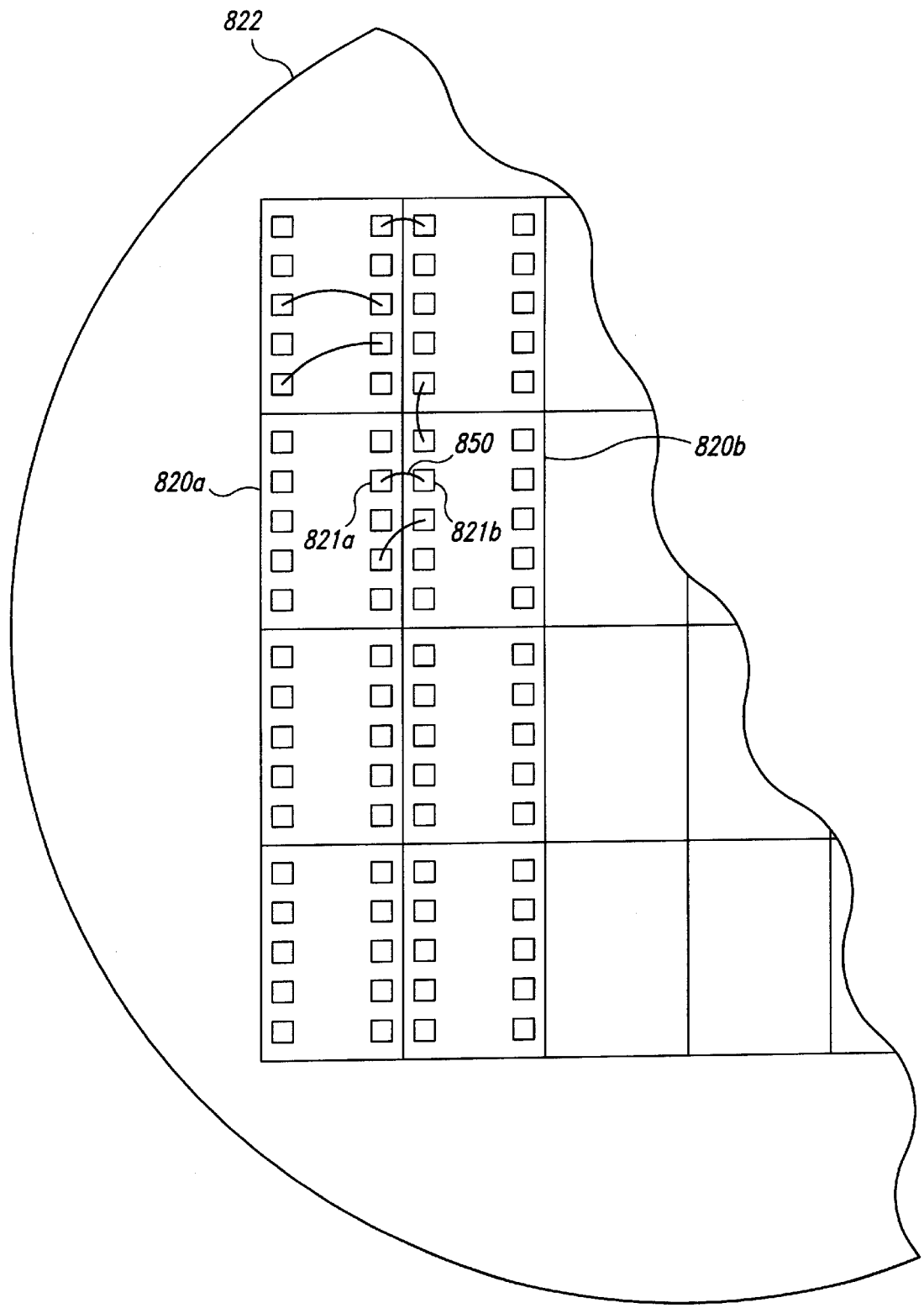
FIG. 8 is a top plan view of a wafer having a plurality of interconnected microelectronic dies in accordance with yet another embodiment of the invention.

FIG. 8 is a top plan view of a microelectronic wafer 822 having a plurality of microelectronic dies 820, including a first microelectronic die 820*a* and a second microelectronic die 820*b*. The first die 820*a* can include a first bond pad 821*a* and the second die 820*b* can include a second bond pad 821*b*. A conductive member 850 can be connected between the bond pads 821*a* and 821*b* to interconnect microelectronic dies positioned on the wafer 822.

An advantage of the embodiment shown in FIG. 8 is that two or more microelectronic dies 820 can be connected to each other to form a larger device before the dies 820 are separated from the wafer 822. For example, several memory dies can be connected to form a device having a larger memory capacity. Accordingly, the dies 820 form building blocks and the same die design can be used for both relatively small and relatively large memory devices. By connecting the dies of the relatively large device before the dies are separated, the individual dies need not be separated at all, reducing the likelihood that the dies will be damaged during separation. Furthermore, this arrangement virtually eliminates the possibility that the dies will be misaligned relative to each other when they are connected together.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A microelectronic device assembly, comprising:
   a microelectronic device having a surface separating a region interior to the microelectronic device from a region exterior to the microelectronic device;
   a first bond pad on the surface of the microelectronic device;
   a second bond pad on the surface of the microelectronic device, the second bond pad being spaced apart from the first bond pad, at least one of the first or second bond pads being positioned proximate an edge of the microelectronic device;
   a third bond pad on the surface of the microelectronic device;
   a conductive structure extending over the surface of the microelectronic device;
   a conductive element disposed beneath the surface of the microelectronic device and the conductive structure and connected between the first and third bond pads; and
   a conductive member that includes at least one of an approximately flat metal layer and an electrically conductive epoxy, the conductive member being bonded to and extending directly between the first and second bond pads at least proximate to the surface of the microelectronic device, the conductive member being in the exterior region of the microelectronic device.

2. The assembly of claim 1 wherein the conductive member is spaced apart from the surface of the microelectronic device.

3. The assembly of claim 1, further comprising an electrically insulating material between the conductive member and the surface of the microelectronic device.

4. The assembly of claim 1, further comprising a dielectric material between the conductive member and the surface of the microelectronic device.

5. The assembly of claim 1 wherein the conductive member is on the surface of the microelectronic device.

6. The assembly of claim 1 wherein the conductive member includes a wire.

7. The assembly of claim 1 wherein the conductive member includes a wire bonded to a wire bump.

8. The assembly of claim 1 wherein the conductive member is a first conductive member, further comprising a conductive structure at least proximate to the microelectronic device, the conductive structure being connected to at least one of the first and second bond pads with a second conductive member.

9. The assembly of claim 8 wherein the conductive structure includes a lead frame.

10. The assembly of claim 1 wherein the conductive member is a first conductive member, further comprising a second conductive member coupled to at least one of the first and second bond pads.

11. The assembly of claim 10 wherein the second conductive member is connected to a portion of the first conductive member adjacent the one of the first and second bond pads.

12. The assembly of claim 1, further comprising a substrate that faces the surface of the microelectronic device, the substrate having a first terminal connected to the conductive member proximate to the first bond pad, the substrate further having a second terminal spaced apart from the first terminal and connected to the conductive member proximate to the second bond pad.

13. A microelectronic device assembly, comprising:
   a microelectronic device having a bond pad at least proximate to a surface separating a region interior to the microelectronic device from a region exterior to the microelectronic device;
   a conductive structure positioned at least proximate to the microelectronic device;
   a first conductive member bonded to and extending directly between the bond pad and the conductive structure, the first conductive member being in the exterior region of the microelectronic device and having a bond region connected to the bond pad, the bond region of the first conductive member including a first bonding surface facing the bond pad and a second bonding surface generally opposite the first bonding surface; and
   a second conductive member bonded to the second bonding surface of the bond region of the first conductive member.

14. The assembly of claim 13 wherein the microelectronic device includes a microelectronic wafer having a plurality of microelectronic dies, the bond pad being positioned on one of the microelectronic dies.

15. The assembly of claim 13 wherein the microelectronic device includes a microelectronic die.

16. The assembly of claim 13 wherein the second conductive member has a first end and a second end opposite the first end, the second conductive member being connected toward the first end to the second bonding surface of the first conductive member, the second conductive member being connected toward the second end to the second bond pad to extend between the first and second bond pads proximate to the surface of the microelectronic device.

17. The assembly of claim 13 wherein the conductive structure includes at least a portion of a lead frame.

18. The assembly of claim 13 wherein the first conductive member is connected to the bond pad with a wedge bond formed by forcing a side surface of the first conductive member against the bond pad to deform the side surface of the first conductive member and the second conductive member is connected to the wedge bond of the first conductive member with a ball bond that includes an enlarged portion at an end of the second conductive member engaged with the wedge bond, the enlarged portion having had at least one of heat and pressure applied thereto while at least part of the second conductive member extends in a direction generally normal to the bond pad to connect the second conductive member to the wedge bond of the first conductive member.

19. The assembly of claim 13 wherein the first conductive member is connected to the bond pad with a ball bond that includes an enlarged portion at an end of the first conductive member engaged with the bond pad, the enlarged portion having had at least one of heat and pressure applied thereto while at least part of the first conductive member extends in a direction generally normal to the bond pad to connect the first conductive member to the bond pad, and the second conductive member is connected to the ball bond of the first conductive member with a wedge bond formed by forcing a side surface of the second conductive member against the ball bond to deform the side surface of the second conductive member.

20. The assembly of claim 13 wherein the first conductive member is connected to the bond pad with a first wedge bond formed by forcing a side surface of the first conductive member against the bond pad to deform the side surface of the first conductive member and the second conductive member is connected to the wedge bond of the first conductive member with a second wedge bond formed by forcing a side surface of the second conductive member against the first wedge bond of the first conductive member to deform the side surface of the second conductive member.

21. The assembly of claim 13 wherein the first conductive member is connected to the bond pad with a first ball bond that includes an enlarged portion at an end of the first conductive member engaged with the bond pad, the enlarged portion having had at least one of heat and pressure applied thereto while at least part of the first conductive member extends in a direction generally normal to the bond pad to connect the first conductive member to the bond pad, and the second conductive member is connected to the first ball bond of the first conductive member with a second ball bond that includes an enlarged portion at an end of the second conductive member engaged with the first ball bond, the enlarged portion of the second conductive member having had at least one of heat and pressure applied thereto while at least part of the second conductive member extends in a direction generally normal to the bond pad to connect the second conductive member to the first ball bond.

22. The assembly of claim 13 wherein at least one of the first and second conductive member includes gold.

23. The assembly of claim 13 wherein at least one of the first and second conductive members includes aluminum.

24. A microelectronic device assembly, comprising:
a microelectronic device having a first bond pad at least proximate to a surface of the microelectronic device and a second bond pad at least proximate to the surface of the microelectronic device and spaced apart from the first bond pad;
a first wire having a first end coupleable to a conductive structure and a second end having a bond region connected to the first bond pad, the bond region including a first bonding surface facing the first bond pad and a second bonding surface generally opposite the first bonding surface; and
a second wire having first and second ends and being bonded to the second bonding surface of the first bond region of the first wire at least proximate to the first end of the second wire, the second wire being connected to the second bond pad at least proximate to the second end of the second wire.

25. The assembly of claim 24 wherein the second wire is positioned adjacent the first surface.

26. The assembly of claim 24 wherein the second wire is spaced apart from first surface.

27. The assembly of claim 24 further comprising an insulating material at least partially surrounding the second wire.

28. The assembly of claim 24 wherein the second wire is spaced apart from the first surface, further comprising an insulating material positioned between the second wire and the first surface.

29. The assembly of claim 24 wherein the second wire is sized to produce a selected capacitance when coupled between the first and second bond pads.

30. The assembly of claim 24 wherein the first wire is connected to the first bond pad with a wedge bond formed by forcing a side surface of the first wire against the first bond pad to deform the side surface of the first wire and the second wire is connected to the wedge bond of the first wire with a ball bond that includes an enlarged portion at an end of the second wire engaged with the wedge bond, the enlarged portion having had at least one of heat and pressure applied thereto while at least part of the second wire extends in a direction generally normal to the first bond pad to connect the second wire to the first wire.

31. The assembly of claim 24 wherein the first wire is connected to the first bond pad with a ball bond that includes an enlarged portion at an end of the first wire engaged with the first bond pad, the enlarged portion having had at least one of heat and pressure applied thereto while at least part of the first wire extends in a direction generally normal to the first bond pad to connect the first wire to the first bond pad, and the second wire is connected to the ball bond of the first wire with a wedge bond formed by forcing a side surface of the second wire against the ball bond to deform the side surface of the second wire.

32. The assembly of claim 24 wherein the first wire is connected to the first bond pad with a first wedge bond formed by forcing a side surface of the first wire against the first bond pad to deform the side surface of the first wire and the second wire is connected to the wedge bond of the first wire with a second wedge bond formed by forcing a side surface of the second wire against the first wedge bond of the first wire to deform the side surface of the second wire.

33. A microelectronic device assembly, comprising:
a microelectronic device having a first surface, a second surface opposite the first surface, a first bond pad at least proximate the first surface, and a second bond pad at least proximate to the first surface and spaced apart from the first bond pad; and
a flowable conductive material proximate to the first surface, the conductive material being bonded to and extending between the first and second bond pads to electrically couple the first and second bond pads.

34. The assembly of claim 33 wherein the flowable conductive material includes a conductive epoxy that hardens after being connected to the first and second bond pads.

35. The assembly of claim 33 wherein the flowable conductive material is spaced apart from the first surface, further comprising an electrically insulating material between the flowable conductive material and the first surface.

36. A microelectronic assembly, comprising:
a microelectronic device having at least one bond pad for receiving wire connections;
a first wire having a first end coupleable to a conductive structure and a second end connected to the one bond pad with a wedge bond formed by forcing a side surface of the first wire against the bond pad to deform the side surface of the first wire; and
a second wire bonded to the wedge bond of the first wire with a ball bond that includes an enlarged portion at an end of the second wire engaged with the wedge bond, the enlarged portion having had at least one of heat and pressure applied thereto while at least part of the second wire extends in a direction generally normal to the bond pad to connect the second wire to the bond pad.

37. The assembly of claim 36 wherein the bond pad is a first bond pad, the microelectronic device having a second bond pad spaced apart from the first bond pad, further comprising a conductive structure, the first wire being connected between the first bond pad and the conductive structures, the second wire being connected between the first bond pad and the second bond pad.

38. The assembly of claim 36 wherein the wedge bond is formed by clipping the first wire adjacent the bond pad.

39. The assembly of claim 36 wherein the wedge bond is formed by squeezing the first wire between a tool and the first bond pad to disconnect a portion of the first wire adjacent the bond pad.

40. A microelectronic device assembly, comprising:
a microelectronic device having at least one bond pad for receiving wire connections;
a first wire having a first end coupleable to a conductive structure and a second end connected to the one bond pad with a ball bond that includes an enlarged portion at an end of the first wire, the enlarged portion being engaged with the bond pad and having had at least one of heat and pressure applied thereto while at least part of the first wire extends in a direction generally normal to the bond pad to connect the first wire to the bond pad; and
a second wire bonded to the ball bond of the first wire with a wedge bond formed by forcing a side surface of the second wire against the ball bond to deform the side portion of the second wire.

41. The assembly of claim 40 wherein the bond pad is a first bond pad, the microelectronic device having a second bond pad spaced apart from the first bond pad, further comprising a conductive structure, the first wire being connected between the first bond pad and the conductive structure, the second wire being connected between the first bond pad and the second bond pad.

42. The assembly of claim 40 wherein the wedge bond is formed by clipping the second wire adjacent the bond pad.

43. The assembly of claim 40 wherein the wedge bond is formed by squeezing the second wire between a tool and the first bond pad to disconnect a portion of the first wire adjacent the bond pad.

44. A microelectronic device assembly, comprising:
a microelectronic device having at least one bond pad for receiving wire connections;
a first wire having a first end coupleable to a conductive structure and a second end connected to the bond pad with a first wedge bond formed by forcing a side surface of the first wire against the bond pad to deform the side surface of the first wire; and
a second wire bonded to the wedge bond of the first wire with a second wedge bond formed by forcing a side surface of the second wire against the first wedge bond of the first wire to deform the side surface of the second wire.

45. The assembly of claim 44 wherein the bond pad is a first bond pad, the microelectronic device having a second bond pad spaced apart from the first bond pad, further comprising a conductive structure, the first wire being connected between the first bond pad and the conductive members, the second wire being connected between the first bond pad and the second bond pad.

46. The assembly of claim 44 wherein at least one of the first and second wedge bonds is formed by clipping the corresponding one of the first and second wires adjacent the bond pad.

47. The assembly of claim 44 wherein at least one of the first and second wedge bonds is formed by squeezing the corresponding one of the first and second wires between a tool and the bond pad to disconnect a portion of the one wire adjacent the bond pad.

48. The assembly of claim 13 wherein the first conductive member is at least proximate to the surface of the microelectronic device.

49. The assembly of claim 13 wherein the conductive structure comprises a second bond pad positioned at least proximate to the surface of the microelectronic device.

50. A microelectronic device assembly, comprising:
a microelectronic device having a surface separating a region interior to the microelectronic device from a region exterior to the microelectronic device;
a first bond pad on the surface of the microelectronic device;
a second bond pad on the surface of the microelectronic device, the second bond pad being spaced apart from the first bond pad, at least one of the first or second bond pads being a signal-carrying bond pad;
a first conductive member that includes at least one of an approximately flat metal layer and an electrically conductive epoxy, the conductive member being bonded to and extending directly between the first and second bond pads at least proximate to the surface of the microelectronic device, the conductive member being in the exterior region of the microelectronic device;
third and fourth bond pads on the surface of the microelectronic device; and
a second conductive member connected between the third and fourth bond pads.

51. The assembly of claim 50 wherein the conductive member is spaced apart from the surface of the microelectronic device.

52. The assembly of claim 50 further comprising an electrically insulating material between the conductive member and the surface of the microelectronic device.

53. The assembly of claim 50 wherein the conductive member is a first conductive member, further comprising a conductive structure at least proximate to the microelectronic device, the conductive structure being connected to at least one of the first and second bond pads with a second conductive member.

54. The assembly of claim 50 wherein the conductive member is a first conductive member, further comprising a second conductive member coupled to at least one of the first and second bond pads.

55. The assembly of claim 54 wherein the second conductive member is connected to a portion of the first conductive member adjacent the one of the first and second bond pads.

56. A microelectronic device assembly, comprising:
a microelectronic device having a surface separating a region interior to the microelectronic device from a region exterior to the microelectronic device;
a first bond pad on the surface of the microelectronic device;
a second bond pad on the surface of the microelectronic device, the second bond pad being spaced apart from the first bond pad, at least one of the first or second bond pads being positioned proximate an edge of the microelectronic device;
a first conductive member that includes at least one of an approximately flat metal layer and an electrically conductive epoxy, the conductive member being bonded to and extending directly between the first and second bond pads at least proximate to the surface of the microelectronic device, the conductive member being in the exterior region of the microelectronic device;
third and fourth bond pads on the surface of the microelectronic device; and
a second conductive member connected between the third and fourth bond pads.

57. The assembly of claim 56 wherein at least one of the first or second conductive members is spaced apart from the surface of the microelectronic device.

58. The assembly of claim 56, further comprising an electrically insulating material between the surface of the microelectronic device and at least one of the first or second conductive members.

59. The assembly of claim 56 wherein at least one of the first or second conductive members comprises a wire.

60. The assembly of claim 56 wherein at least one of the first or second conductive members includes an approximately flat metal layer.

61. The assembly of claim 56 wherein the microelectronic device includes a microelectronic wafer having a plurality of microelectronic dies and the first and second bond pads are positioned on one of the microelectronic dies.

62. The assembly of claim 56 wherein the microelectronic device includes a microelectronic wafer having a plurality of microelectronic dies, the first bond pad being positioned on a first one of the microelectronic dies and the second bond pad being positioned on a second one of the microelectronic dies.

63. A microelectronic device assembly, comprising:
a microelectronic device having a surface separating a region interior to the microelectronic device from a region exterior to the microelectronic device and including a microelectronic wafer having a plurality of microelectronic dies;
a first bond pad on the surface of one of the microelectronic dies;
a second bond pad on the surface of the one of the microelectronic dies, the second bond pad being spaced apart from the first bond pad, at least one of the first or second bond pads being positioned proximate an edge of the microelectronic device; and
a conductive member that includes at least one of an approximately flat metal layer and an electrically conductive epoxy, the conductive member being bonded to and extending directly between the first and second bond pads at least proximate to the surface of the microelectronic device, the conductive member being in the exterior region of the microelectronic device.

64. The assembly of claim 63 wherein at least one of the first or second conductive members is spaced apart from the surface of the microelectronic device.

65. The assembly of claim 63, further comprising an electrically insulating material between the surface of the microelectronic device and at least one of the first or second conductive members.

66. The assembly of claim 63 wherein at least one of the first or second conductive members comprises a wire.

67. The assembly of claim 63 wherein at least one of the first or second conductive members includes an approximately flat metal layer.

68. A microelectronic device assembly, comprising:
a microelectronic device having a surface separating a region interior to the microelectronic device from a region exterior to the microelectronic device and including a microelectronic wafer having a plurality of microelectronic dies;
a first bond pad on the surface of a first one of the microelectronic dies;
a second bond pad on the surface of a second one of the microelectronic dies, the second bond pad being spaced apart from the first bond pad, at least one of the first or second bond pads being positioned proximate an edge of the microelectronic device; and
a conductive member that includes at least one of an approximately flat metal layer and an electrically conductive epoxy, the conductive member being bonded to and extending directly between the first and second bond pads at least proximate to the surface of the microelectronic device, the conductive member being in the exterior region of the microelectronic device.

69. The assembly of claim 68 wherein at least one of the first or second conductive members is spaced apart from the surface of the microelectronic device.

70. The assembly of claim 68, further comprising an electrically insulating material between the surface of the microelectronic device and at least one of the first or second conductive members.

71. The assembly of claim 68 wherein at least one of the first or second conductive members comprises a wire.

72. The assembly of claim 68 wherein at least one of the first or second conductive members includes an approximately flat metal layer.

73. A microelectronic device assembly, comprising:
a microelectronic device having a surface separating a region interior to the microelectronic device from a region exterior to the microelectronic device and including a microelectronic wafer having a plurality of microelectronic dies;
a first bond pad on the surface of one of the microelectronic dies;
a second bond pad on the surface of the one of the microelectronic dies, the second bond pad being spaced apart from the first bond pad, at least one of the first or second bond pads being a signal-carrying bond pad; and
a conductive member that includes at least one of an approximately flat metal layer and an electrically conductive epoxy, the conductive member being bonded to and extending directly between the first and second bond pads at least proximate to the surface of the microelectronic device, the conductive member being in the exterior region of the microelectronic device.

74. The assembly of claim 73 wherein the conductive member is spaced apart from the surface of the microelectronic device.

75. The assembly of claim 73, further comprising an electrically insulating material between the conductive member and the surface of the microelectronic device.

76. The assembly of claim 73 wherein the conductive member is a first conductive member, further comprising a conductive structure at least proximate to the microelectronic device, the conductive structure being connected to at least one of the first and second bond pads with a second conductive member.

77. The assembly of claim 73 wherein the conductive member is a first conductive member, further comprising a second conductive member coupled to at least one of the first and second bond pads.

78. The assembly of claim 77 wherein the second conductive member is connected to a portion of the first conductive member adjacent the one of the first and second bond pads.

79. The assembly of claim 73 wherein the conductive member is a first conductive member further comprising:
   third and fourth bond pads on the surface of the microelectronic device; and
   a second conductive member connected between the third and fourth bond pads.

* * * * *